US010917071B2

(12) United States Patent
Takamine

(10) Patent No.: US 10,917,071 B2
(45) Date of Patent: Feb. 9, 2021

(54) MULTIPLEXER, RADIO-FREQUENCY FRONT-END CIRCUIT, AND COMMUNICATION APPARATUS

(71) Applicant: Murata Manufacturing Co., Ltd., Nagaokakyo (JP)

(72) Inventor: Yuichi Takamine, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 22 days.

(21) Appl. No.: 16/218,531

(22) Filed: Dec. 13, 2018

(65) Prior Publication Data
US 2019/0123720 A1    Apr. 25, 2019

Related U.S. Application Data

(63) Continuation of application No. PCT/JP2017/017556, filed on May 9, 2017.

(30) Foreign Application Priority Data

Jun. 29, 2016  (JP) .................................. 2016-129101

(51) Int. Cl.
*H03H 9/64*    (2006.01)
*H04B 1/52*    (2015.01)
(Continued)

(52) U.S. Cl.
CPC ...... *H03H 9/6483* (2013.01); *H03H 9/02574* (2013.01); *H03H 9/14541* (2013.01);
(Continued)

(58) Field of Classification Search
CPC ............. H03H 9/6483; H03H 9/02574; H03H 9/14541; H03H 9/725; H03H 9/706; H04B 1/00; H04B 1/0057; H04B 1/52
(Continued)

(56) References Cited

U.S. PATENT DOCUMENTS 6,326,864 B1    12/2001 Takamine et al.
2002/0180308 A1*    12/2002 Taniguchi ............ H03H 9/0576
                                                      310/313 R
(Continued)

FOREIGN PATENT DOCUMENTS

JP     10-215144 A    8/1998
JP     2000-261288 A    9/2000
(Continued)

OTHER PUBLICATIONS

Chien, A., "Multiplexers for Multi-band Wireless Handset Applications", Microwave Journal, Jul. 5, 2007 (Year: 2007).*
(Continued)

*Primary Examiner* — Benny T Lee
*Assistant Examiner* — Hafizur Rahman
(74) *Attorney, Agent, or Firm* — Keating & Bennett, LLP

(57) ABSTRACT

A quadplexer includes a first filter and a second filter whose passband has frequencies higher than the first filter. The first filter has a ladder filter structure including series resonators disposed on a first path and parallel resonators disposed on a path connecting the first path and ground. A series resonator that is closest to a common terminal among the series resonators includes an IDT electrode that excites elastic waves, and a reflector that reflects the elastic waves excited by the IDT electrode. A distance between the IDT electrode and the reflector is greater than or equal to about 0.44λ and less than about 0.5λ where λ is a wavelength of the elastic waves that is defined by an electrode cycle of the IDT electrode.

20 Claims, 8 Drawing Sheets

(51) Int. Cl.
*H04B 1/00* (2006.01)
*H03H 9/145* (2006.01)
*H03H 9/02* (2006.01)
*H03H 9/72* (2006.01)
*H03H 9/70* (2006.01)

(52) U.S. Cl.
CPC .............. *H03H 9/725* (2013.01); *H04B 1/00* (2013.01); *H04B 1/0057* (2013.01); *H04B 1/52* (2013.01); *H03H 9/706* (2013.01)

(58) Field of Classification Search
USPC ........................................................ 333/193
See application file for complete search history.

(56) References Cited

U.S. PATENT DOCUMENTS

| | | | |
|---|---|---|---|
| 2013/0285768 A1* | 10/2013 | Watanabe | H03H 9/02834 333/193 |
| 2016/0156334 A1* | 6/2016 | Nakagawa | H03H 9/6469 333/133 |
| 2016/0261249 A1 | 9/2016 | Takamine | |
| 2017/0063337 A1* | 3/2017 | Hara | H03H 9/6433 |

FOREIGN PATENT DOCUMENTS

| | | | | |
|---|---|---|---|---|
| JP | 2003-032080 A | | 1/2003 | |
| JP | 2012-028896 A | | 2/2012 | |
| WO | WO-2015033891 A1 | * | 3/2015 | ......... H03H 9/14591 |
| WO | 2015/080045 A1 | | 6/2015 | |

OTHER PUBLICATIONS

Gillenwater, T. "Evolution of the Smartphone", Microwave Journal, Feb. 14, 2017 (Year: 2017).*
Koelle, U. "Multiplexers in Mobile Handsets with LTE Advanced Carrier Aggregation", Microwave Journal, Nov. 13, 2015 (Year: 2015).*
Machine Translation of Onazawa Yasuhide (JP2003032080) (Year: 2003).*
Peter Hess, "Surface Acoustic Waves in Material Science", Physics Today 55, 3, 42 (2002). (Year: 2002).*
RF Filter Technologies for Dummies, Qorvo Special Edition, John Wiley & Sons, 2015 (Year: 2015).*
Official Communication issued in International Patent Application No. PCT/JP2017/017556, dated Jul. 25, 2017.
Qorvo "White Paper: Addressing Carrier Aggregation Challenges Using Multiplexer Solutions", https://www.qorvo.com/resources/d/qorvo-addressing-carrier-aggregation-challenges-using-multiplexer-solutions-white-paper-january-2016, Jan. 2016, pp. 1-6.

* cited by examiner

MULTIPLEXER, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2016-129101 filed on Jun. 29, 2016 and is a Continuation Application of PCT Application No. PCT/JP2017/017556 filed on May 9, 2017. The entire contents of each application are hereby incorporated herein by reference.

BACKGROUND OF THE INVENTION

1. Field of the Invention

The present invention relates to a multiplexer, a radio-frequency front-end circuit, and a communication apparatus.

2. Description of the Related Art

In recent years, a demultiplexer for isolating (demultiplexing) a radio-frequency (RF) signal in units of frequency bands in order to cope with a plurality of frequency bands and a plurality of wireless systems, namely, multi-bands and multi-modes, using one terminal has been widely used in communication apparatuses, such as cellular phone terminals. As such a demultiplexer, a quadplexer configured by combining two duplexers, each including a transmission filter and a reception filter, has been proposed (for example, see Japanese Unexamined Patent Application Publication No. 2012-028896).

In a multiplexer, such as a quadplexer configured as described above, because paths going through the individual filters are connected to each other, one filter's characteristics may affect another filter's characteristics. Therefore, one filter's characteristics that do not cause problems in that filter may deteriorate another filter's characteristics. Specifically, one filter's stopband ripples (ripples generated in that filter's stopband) do not affect characteristics in that filter's passband. However, in the case in which a frequency at which the stopband ripples are generated is located in another filter's passband, this may increase ripples in this other filter's passband (passband ripples).

SUMMARY OF THE INVENTION

Preferred embodiments of the present invention provide multiplexers, RF front-end circuits, and communication apparatuses each capable of reducing or preventing ripples in a passband.

A multiplexer according to a preferred embodiment of the present invention includes a common terminal; a first terminal and a second terminal; a first filter disposed on a first path connecting the common terminal and the first terminal; and a second filter disposed on a second path connecting the common terminal and the second terminal, the second filter having a passband whose frequencies are higher than the first filter. The first filter has a ladder filter structure including one or more series resonators disposed on the first path and one or more parallel resonators disposed on a path connecting the first path and ground. A series resonator that is closest to the common terminal among the one or more series resonators includes an IDT electrode that excites elastic waves, and a reflector that reflects the elastic waves excited by the IDT electrode. A distance between the IDT electrode and the reflector is greater than or equal to about $0.44\lambda$ and less than about $0.5\lambda$ where $\lambda$ is a wavelength of the elastic waves that is defined by an electrode cycle of the IDT electrode.

That is, the inventor of preferred embodiments of the present invention discovered as a result of extensive study that ripples in the passband are able to be reduced or prevented when the distance between the IDT electrode and the reflector is greater than or equal to about $0.44\lambda$ and less than about $0.5\lambda$ in the series resonator of the first filter closest to the common terminal. Specifically, if the distance between the IDT electrode and the reflector is too small, ripples in the passband of the first filter increase. Alternatively, if the distance between the IDT electrode and the reflector is too large, ripples in the passband of the second filter increase. Therefore, ripples in the passband are able to be reduced or prevented in both of the first and second filters by maintaining the distance between the IDT electrode and the reflector within an appropriate range.

In addition, a series resonator that is closest to the common terminal among the one or more series resonators is disposed such that the distance between the IDT electrode and the reflector may be less than or equal to about $0.48\lambda$.

That is, the inventor of preferred embodiments of the present invention discovered that, as a result of extensive study, an increase in ripples in the passband of the second filter is able to be reliably reduced or prevented when the distance between the IDT electrode and the reflector is less than or equal to about $0.48\lambda$. Specifically, if the distance between the IDT electrode and the reflector is increased to approach about $0.5\lambda$, ripples in the passband of the second filter may increase. Therefore, ripples in the second filter are able to be more reliably reduced or prevented by setting the distance between the IDT electrode and the reflector to less than or equal to about $0.48\lambda$.

In addition, the reflector may be disposed in a direction in which the elastic waves propagate with respect to the IDT electrode.

Accordingly, because elastic waves excited by the IDT electrode are able to be efficiently confined, leakage of the elastic waves to the outside is able to be reduced or prevented. Therefore, the filter characteristics of the first filter are able to be improved.

In addition, the first filter may have a ladder filter structure including a plurality of stages.

Accordingly, the bandpass characteristics of the entire first filter is able to be finely adjusted.

In addition, the first filter may further include a longitudinally-coupled filter structure disposed on the first path.

Accordingly, the multiplexer is able to adapt to required filter characteristics such as enhancement of attenuation.

In addition, the multiplexer may further include a piezoelectric film including a main surface on which the IDT electrode and the reflector are provided; a high-acoustic-velocity supporting substrate in which an acoustic velocity of bulk waves propagating therethrough is higher than an acoustic velocity of elastic waves propagating through the piezoelectric film; and a low-acoustic-velocity film arranged between the high-acoustic-velocity supporting substrate and the piezoelectric film, in which an acoustic velocity of bulk waves propagating therethrough is lower than an acoustic velocity of bulk waves propagating through the piezoelectric film.

Accordingly, the Q factor of each resonator including the IDT electrode is able to be maintained at a high value.

In addition, the multiplexer may be defined by a first duplexer including two filters including the first filter and a second duplexer including two filters including the second filter.

Accordingly, ripples in the passband are able to be reduced or prevented in a multiplexer including a plurality of duplexers.

In addition, the passband of the first filter may be an uplink frequency band of Band 3, and the passband of the second filter may be an uplink frequency band of Band 1.

In the case in which the passband of the first filter is an uplink frequency band of Band 3 and the passband of the second filter is an uplink frequency band of Band 1, ripples in the passband of the second filter tend to increase. Thus, the increase of ripples is able to be effectively reduced or prevented by configuring the series resonator, closest to the common terminal, of the first filter to have the above-described structure.

In addition, a radio-frequency front-end circuit according to a preferred embodiment of the present invention includes any of the above-described multiplexers, and an amplifier circuit connected to the multiplexer.

Accordingly, a radio-frequency front-end circuit capable of reducing or preventing ripples in a passband is able to be provided.

In addition, a communication apparatus according to a preferred embodiment of the present invention includes an RF signal processing circuit that processes a radio frequency signal transmitted and received by an antenna element; and the above-described radio-frequency front-end circuit that transfers the radio frequency signal between the antenna element and the RF signal processing circuit.

Accordingly, a communication apparatus capable of reducing or preventing ripples in a passband is able to be provided.

According to preferred embodiments of the present invention, ripples in the passband are able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
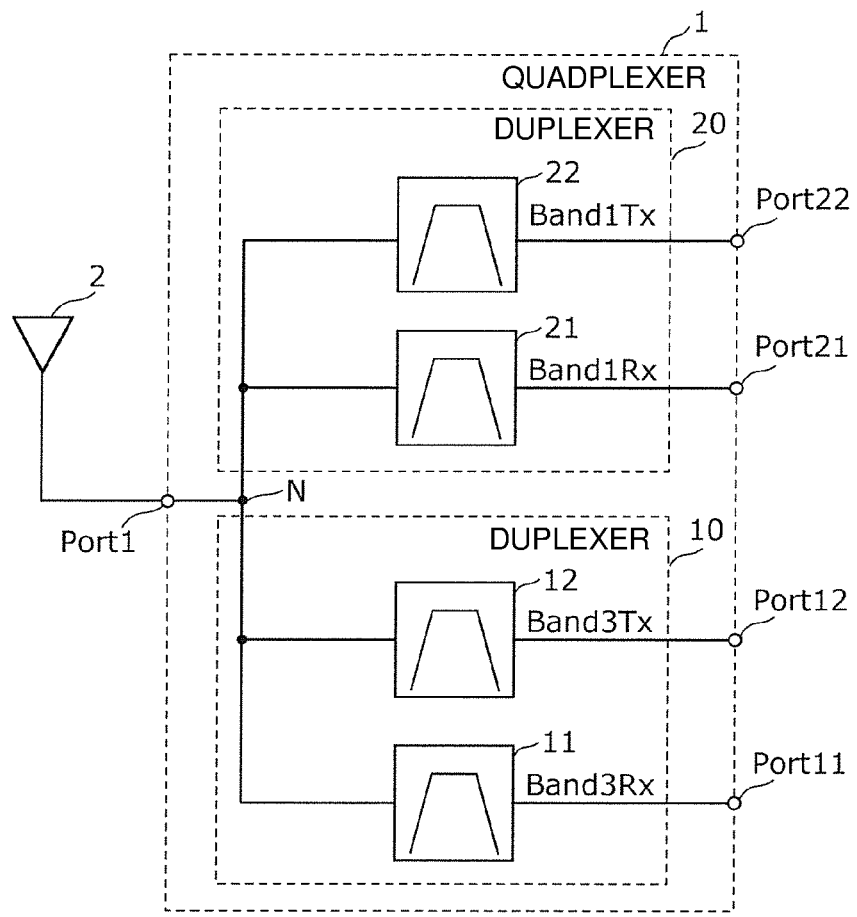
FIG. 1 is a configuration diagram of a quadplexer according to a first preferred embodiment of the present invention.

Hereinafter, preferred embodiments of the present invention will be described in detail with reference to the accompanying drawings. Note that all of the preferred embodiments described below illustrate comprehensive or specific examples. Numerals, shapes, materials, elements, and the arrangement and connection structure of the elements discussed in the following preferred embodiments are only exemplary and are not construed to limit the present invention. Among the elements in the following preferred embodiments, elements that are not described in independent claims are described as arbitrary elements. In addition, the sizes or size ratios of elements illustrated in the drawings are not necessarily precise. In addition, the same or substantially the same configurations in the drawings are denoted by the same reference symbol, and overlapping descriptions may be omitted or simplified. In the following preferred embodiments, "connected" includes not only the case in which elements are directly connected to each other, but also the case in which elements are electrically coupled to each other with another element interposed therebetween.

First Preferred Embodiment

In a first preferred embodiment of the present invention, a quadplexer will be described as an example of a multiplexer.

FIG. 1 is a configuration diagram of a quadplexer 1 according to the present preferred embodiment. Note that an antenna element 2, connected to a common terminal Port 1 of the quadplexer 1, is also illustrated in the diagram.

The quadplexer 1 is a multiplexer (demultiplexer) including a plurality of filters (here, four filters 11, 12, 21, and 22) with different passbands, and antenna-side terminals of the filters are bundled at the common terminal Port 1. In other words, one of two terminals of each of these filters is connected to the common terminal Port 1.

In the present preferred embodiment, the quadplexer 1 supports LTE (Long Term Evolution), and allows RF signals in later-described bands defined by 3GPP (Third Generation Partnership Project) to pass.

Specifically, as illustrated in FIG. 1, the quadplexer 1 includes the common terminal Port 1, four individual terminals Port 11, Port 12, Port 21, and Port 22, and the four filters 11, 12, 21, and 22.

The common terminal Port 1 is commonly provided for the four filters 11, 12, 21, and 22, and is connected to the filters 11, 12, 21, and 22 inside the quadplexer 1. In addition, the common terminal Port 1 is connected to the antenna element 2 outside the quadplexer 1. In other words, the common terminal Port 1 also defines and functions as the antenna terminal of the quadplexer 1.

The individual terminals Port 11, Port 12, Port 21, and Port 22 are provided individually for the four filters 11, 12, 21, and 22 in this order, and are connected to corresponding filters inside the quadplexer 1. In addition, the individual terminals Port 11, Port 12, Port 21, and Port 22 are connected to an RF signal processing circuit (for example, RFIC: Radio Frequency Integrated Circuit, not illustrated), with an amplifier circuit or other suitable circuit (not illustrated) interposed therebetween, outside the quadplexer 1.

The filter 11 is a reception filter disposed on a path connecting the common terminal Port 1 and the individual terminal Port 11, and, in the present preferred embodiment, preferably has, for example, a passband that is a downlink frequency band (reception band) of Band 3 (Band 3 Rx).

The filter 12 is a transmission filter disposed on a path connecting the common terminal Port 1 and the individual terminal Port 12, and, in the present preferred embodiment, preferably has, for example, a passband that is an uplink frequency band (transmission band) of Band 3 (Band 3 Tx). In the present preferred embodiment, the filter 12 corresponds to a first filter disposed on a first path connecting the common terminal Port 1 and a first terminal (here, the individual terminal Port 12).

The filter 21 is a reception filter disposed on a path connecting the common terminal Port 1 and the individual terminal Port 21, and, in the present preferred embodiment, preferably has, for example, a passband that is a downlink frequency band (reception band) of Band 1 (Band 1 Rx).

The filter 22 is a transmission filter disposed on a path connecting the common terminal Port 1 and the individual terminal Port 22, and, in the present preferred embodiment, preferably has, for example, a passband that is an uplink frequency band (transmission band) of Band 1 (Band 1 Tx). In the present preferred embodiment, the filter 22 corresponds to a second filter arranged on a second path connecting the common terminal Port 1 and a second terminal (here, the individual terminal Port 22).

These filters 11 and 12 define an unbalanced duplexer 10 (first duplexer) whose passband is Band 3. In addition, the filter and the filter 22 define an unbalanced duplexer 20 (second duplexer) whose passband is Band 1. In other words, the quadplexer 1 according to the present preferred embodiment has a configuration in which a common terminal (antenna terminal) of the duplexer 10 whose passband is Band 3 and a common terminal (antenna terminal) of the duplexer 20 whose passband is Band 1 are defined by the common terminal Port 1. In the present preferred embodiment, a signal path going through the duplexer 10 and a signal path going through the duplexer 20 are connected at a node N. In other words, the node N is a point that bundles these two signal paths and is a common connection point of these two signal paths.

Now, frequency bands assigned to Band 1 and Band 3, which are the passbands of the quadplexer 1 according to the present preferred embodiment, will be described. In the following description, a numerical range indicating A or greater and B or less is simplified as A to B.

Figure 2:
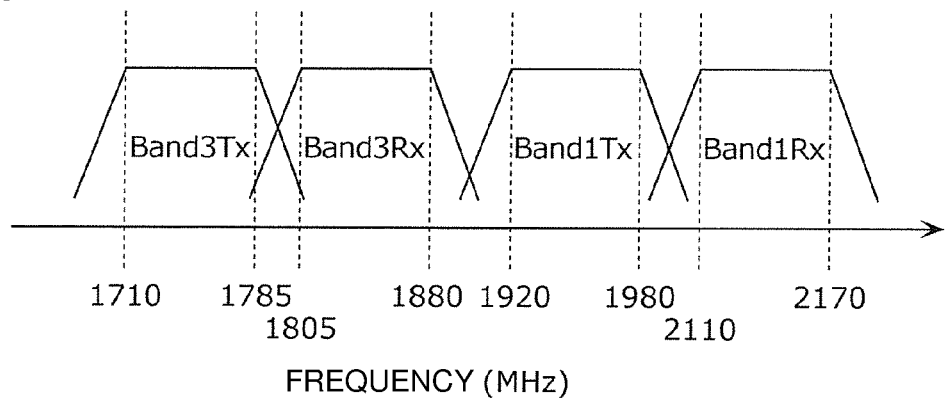
FIG. 2 is a diagram describing frequency bands assigned to Band 1 and Band 3.

FIG. 2 is a diagram describing frequency bands assigned to Band 1 and Band 3. Hereinafter, each Band's reception band (Rx) and transmission band (Tx) may be simplified as a band name and text added at the end thereof that describes a reception band or a transmission band, as in "Band 1 Rx band" for the reception band (Rx) of Band 1.

As illustrated in the diagram, for Band 1, about 1920 MHz to about 1980 MHz is assigned to the transmission band, and about 2110 MHz to about 2170 MHz is assigned to the reception band. For Band 3, about 1710 MHz to about 1785 MHz is assigned to the transmission band, and about 1805 MHz to about 1880 MHz is assigned to the reception band. Therefore, as the filter characteristics of the filters 11, 12, 21, and 22, characteristics that allow signals in the transmission band or reception band of a corresponding Band to pass but attenuate signals in other bands, as indicated by solid lines in the diagram, are required.

As has been described above, the quadplexer 1 includes the filter 12 (first filter) and the filter 22 (second filter) whose passband frequencies are higher than the filter 12. In addition, the quadplexer 1 is includes the duplexer 10 (first duplexer) including two filters (filters 11 and 12 in the present preferred embodiment) including the filter 12 and the duplexer 20 (second duplexer) including two filters (filters 21 and 22 in the present preferred embodiment) including the filter 22.

Note that the passbands of the two duplexers 10 and 20 are not restricted to a combination of Band 3 and Band 1, and may be, for example, a combination of Band 25 and Band 66 or a combination of Band 3 and Band 7. In addition, in the quadplexer 1, an impedance element such as an inductor that provides impedance matching may be connected to a path connecting each of the filters 11, 12, 21, and 22 and the node N, a path connecting the node N and the common terminal Port 1, or the like.

Next, the basic configuration of the filters 11, 12, 21, and 22 will be described by describing, for example, the basic configuration of the filter 12 (first filter) whose passband is Band 3 Tx.

Figure 3:
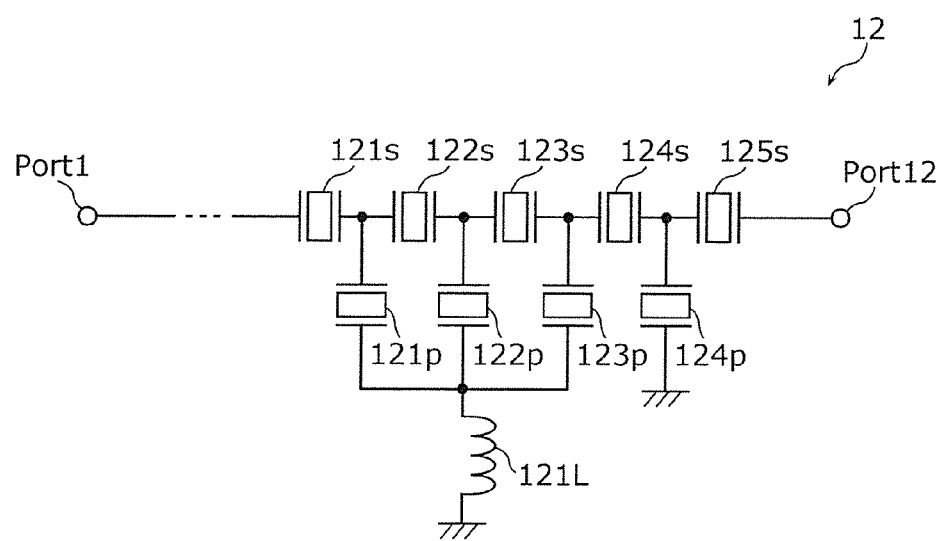
FIG. 3 is a circuit configuration diagram of a filter according to the first preferred embodiment of the present invention.

FIG. 3 is a circuit configuration diagram of the filter 12. As illustrated in the diagram, the filter 12 includes series resonators $121s$ to $125s$, parallel resonators $121p$ to $124p$, and an inductor $121L$.

The series resonators $121s$ to $125s$ are connected in series with each other in this order from the common terminal Port 1 side, on a first path (series arm) connecting the common terminal Port 1 and the individual terminal Port 12. In addition, the parallel resonators $121p$ to $124p$ are connected in parallel with each other on paths (parallel arms) connecting the connection points of the series resonators $121s$ to $125s$ and a reference terminal (ground). Specifically, the parallel resonators $121p$ to $123p$ are connected to the reference terminal with the inductor $121L$ interposed therebetween, and the parallel resonator $124p$ is directly connected to the reference terminal. With the above-described connection configuration of the series resonators $121s$ to $125s$ and the parallel resonators $121p$ to $124p$, the filter 12 defines a ladder band-pass filter.

In this manner, the filter 12 (first filter) has a ladder filter structure including one or more series resonators (for example, five series resonators $121s$ to $125s$ in the present preferred embodiment) disposed on the first path and one or more parallel resonators (for example, four parallel resonators $121p$ to $124p$ in the present preferred embodiment) disposed on a path connecting the first path and a reference terminal (ground). Specifically, the filter 12 has a ladder filter structure including a plurality of stages (for example, four-stage in the present preferred embodiment). Accordingly, the bandpass characteristics of the entire filter 12 are able to be finely adjusted.

Note that the number of series resonators and the number of parallel resonators of the filter 12 are not restricted to five and four, respectively, and the filter 12 only needs to include one or more series resonators and one or more parallel resonators. In other words, the filter 12 only needs to be a ladder filter including one or more stages.

In addition, the parallel resonators 121p to 123p may be directly connected to the reference terminal without the inductor 121L interposed therebetween, or the parallel resonator 124p may be connected to the reference terminal with an inductor interposed therebetween. In addition, an impedance element, such as an inductor, a capacitor, or other suitable element, may be inserted or connected on the series arm or the parallel arms.

Although the reference terminal (ground) to which the parallel resonators 121p to 123p are connected is a common reference terminal and the reference terminal to which the parallel resonator 124p is connected is an individual reference terminal in FIG. 3, the common reference terminal and the individual reference terminal are not restricted to these, and may be arbitrarily selected in accordance with the mounting layout restrictions of the filter 12, for example.

In addition, a parallel resonator may be connected to a node on the common terminal Port 1 side of the series resonator 121s, which is closest to the common terminal port 1, or to a node on the individual terminal Port 12 side of the series resonator 125s, which is closest to the individual terminal Port 12, among the series resonators 121s to 125s defining the ladder filter structure.

Next, the structure of resonators (series resonators and parallel resonators) included in the filter 12 (first filter) will be described. In the present preferred embodiment, the resonators are preferably surface acoustic wave (SAW) resonators, for example.

Note that the other filters 11, 21, and 22 are not restricted to the above-described configuration, and may be arbitrarily designed in accordance with the required filter characteristics and other factors. Specifically, the filters 11, 21, and 22 need not necessarily have a ladder filter structure, and may have, for example, a longitudinally-coupled filter structure. In addition, the resonators included in the filters 11, 21, and 22 are not restricted to SAW resonators, and may be, for example, BAW (Bulk Acoustic Wave) resonators. Furthermore, the filters 11, 21, and 22 may not be resonators, and may be, for example, LC resonance filters or dielectric filters.

Figure 4:
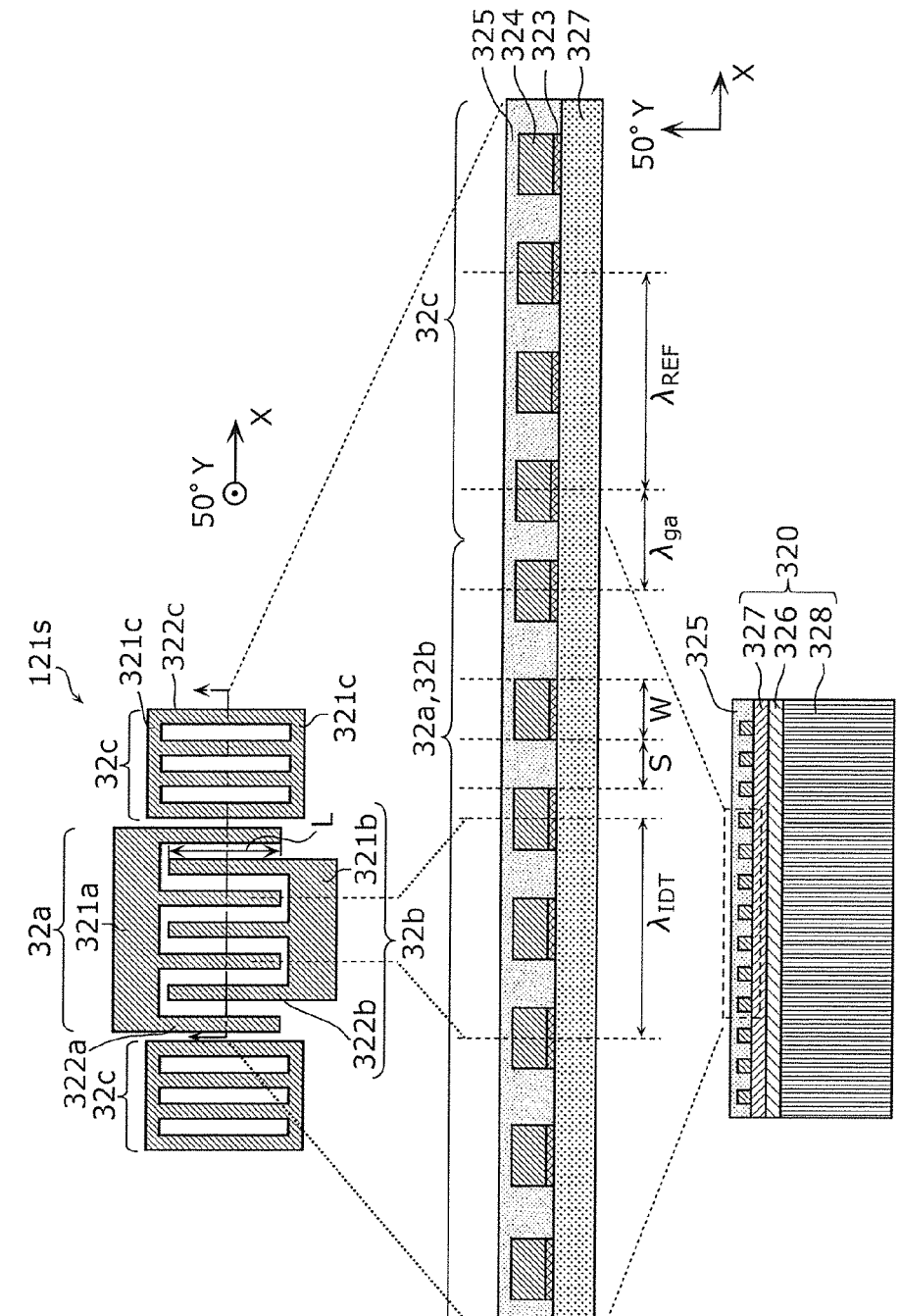
FIG. 4 includes a plan view and a sectional view schematically illustrating a resonator in a filter according to a preferred embodiment of the present invention.

FIG. 4 includes a plan view and a sectional view schematically illustrating a resonator in the filter 12 according to the present preferred embodiment. FIG. 4 illustrates a schematic plan view and a schematic sectional view illustrating the structure of the series resonator 121s, among a plurality of resonators of the filter 12. Note that the series resonator 121s illustrated in FIG. 4 is provided to describe a typical structure of the above-described plurality of resonators, and the number and length of electrode fingers defining an electrode are not restricted to those of the series resonator 121s.

As illustrated in the plan view of FIG. 4, the series resonator 121s includes IDT (interdigital transducer) electrodes 32a and 32b, which excite elastic waves, and reflectors 32c, which reflect the elastic waves excited by the IDT electrodes 32a and 32b. The reflectors 32c are disposed in a direction in which elastic waves propagate, with respect to the IDT electrodes 32a and 32b. Thus, the elastic waves excited by the IDT electrodes 32a and 32b is able to be efficiently confined, thus reducing or preventing leakage of the elastic waves to the outside. Therefore, the filter characteristics of the filter 12 are able to be improved. Specifically, the series resonator 121s includes the pair of IDT electrodes 32a and 32b, which face each other, and the pair of reflectors 32c. Note that one of the paired reflectors 32c may not be provided, depending on the mounting layout restrictions or other factors.

The IDT electrode 32a includes a plurality of electrode fingers 322a, which have a comb shape and are parallel or substantially parallel with each other, and a busbar electrode 321a, which connects the plurality of electrode fingers 322a. In addition, the IDT electrode 32b includes a plurality of electrode fingers 322b, which have a comb shape and are parallel or substantially parallel with each other, and a busbar electrode 321b, which connects the plurality of electrode fingers 322b. The plurality of electrode fingers 322a and 322b are disposed along a direction orthogonal or substantially orthogonal to the X-axis direction.

The paired reflectors 32c are disposed in a direction in which elastic waves propagate (X-axis direction), with respect to the IDT electrodes 32a and 32b. Specifically, the reflectors 32c sandwich the IDT electrodes 32a and 32b in a direction in which elastic waves propagate. Each reflector 32c includes a plurality of reflection electrode fingers 322c, which are parallel or substantially parallel to each other, and a pair of busbar electrodes 321c, including a busbar electrode that connects one of two end portions of the reflection electrode fingers 322c and a busbar electrode connecting the other end portion of the reflection electrode fingers 322c. The plurality of reflection electrode fingers 322c are disposed along a direction orthogonal or substantially orthogonal to the X-axis direction, similar to the plurality of electrode fingers 322a and 322b.

The reflectors 32c provided in this manner are able to confine standing waves of the propagating elastic waves without leaking to the outside of the resonator (here, the series resonator 121s). In doing so, the resonator is able to propagate RF signals in the passband defined by the electrode pitch, the number of pairs, the cross width, and other factors of the IDT electrodes 32a and 32b with low loss while highly attenuating RF signals outside the passband.

In addition, the IDT electrodes 32a and 32b including the plurality of electrode fingers 322a and 322b and the busbar electrodes 321a and 321b preferably have a multilayer structure including an adhesion layer 323 and a main electrode layer 324, as illustrated in the sectional view of FIG. 4. In addition, because the cross-sectional structure of the reflectors 32c is the same or substantially the same as the cross-sectional structure of the IDT electrodes 32a and 32b, a description thereof will be omitted.

The adhesion layer 323 improves the adhesion between a piezoelectric layer 327 and the main electrode layer 324, and, for example, Ti is preferably used as a material of the adhesion layer 323. The film thickness of the adhesion layer 323 is preferably, for example, about 12 nm.

As a material of the main electrode layer 324, for example, Al including about 1% of Cu is preferably used. The film thickness of the main electrode layer 324 is preferably, for example, about 162 nm.

A protection layer 325 covers the IDT electrodes 32a and 32b. The protection layer 325 protects the main electrode layer 324 from the external environment, adjusts the frequency temperature characteristics, and enhances the moisture resistance, and is a film whose main component is preferably, for example, silicon dioxide. The film thickness of the protection layer 325 is preferably, for example, about 25 nm.

Note that the materials used for the adhesion layer 323, the main electrode layer 324, and the protection layer 325 are not restricted to those described above. Furthermore, the IDT electrodes 32a and 32b need not have the above-described multilayer structure. The IDT electrodes 32a and 32b may be made of a metal or an alloy such as Ti, Al, Cu, Pt, Au, Ag, and Pd, or may include a plurality of multilayer bodies made of the above-described metals or alloys. In addition, the protection layer 325 need not be provided.

The IDT electrodes 32a and 32b and reflectors 32c are provided on a main surface of a substrate 320 described below. Hereinafter, the multilayer structure of the substrate 320 will be described.

As illustrated in a lower portion of FIG. 4, the substrate 320 includes a high-acoustic-velocity supporting substrate 328, a low-acoustic-velocity film 326, and the piezoelectric layer 327, and has a structure in which the high-acoustic-velocity supporting substrate 328, the low-acoustic-velocity film 326, and the piezoelectric layer 327 are laminated in this order.

The piezoelectric layer 327 is a piezoelectric film that includes a main surface on which the IDT electrodes 32a and 32b and the reflectors 32c are provided. The piezoelectric layer 327 is preferably made of, for example, a 50° Y-cut X-propagation LiTaO$_3$ piezoelectric single crystal or piezoelectric ceramics (lithium tantalate single crystal cut along a face that has, as a normal, an axis rotated by about 50° from the Y-axis around the X-axis serving as the central axis or ceramics, which is single crystal or ceramics in which surface acoustic waves propagate in the X-axis direction). The thickness of the piezoelectric layer 327 is preferably less than or equal to about 3.5λ where λ is the wavelength of elastic waves defined by the electrode pitch (electrode cycle) of the IDT electrodes 32a and 32b, and is preferably, for example, about 600 nm.

The high-acoustic-velocity supporting substrate 328 supports the low-acoustic-velocity film 326, the piezoelectric layer 327, and the IDT electrodes 32a and 32b. The high-acoustic-velocity supporting substrate 328 is a substrate in which the acoustic velocity of bulk waves propagating through the high-acoustic-velocity supporting substrate 328 is higher than that of elastic waves such as surface waves or boundary waves propagating through the piezoelectric layer 327, and confines surface acoustic waves in a portion in which the piezoelectric layer 327 and the low-acoustic-velocity film 326 are laminated, thus preventing the surface acoustic waves from leaking downward below the high-acoustic-velocity supporting substrate 328. The high-acoustic-velocity supporting substrate 328 is preferably, for example, a silicon substrate, and preferably has a thickness of about 125 μm, for example. Note that the high-acoustic-velocity supporting substrate 328 may be made of, for example, any of the following: (1) aluminum nitride, aluminum oxide, silicon carbide, silicon nitride, silicon, sapphire, an a piezoelectric body such as lithium tantalate, lithium niobate, or crystal; (2) various types of ceramics such as alumina, zirconia, cordierite, mullite, steatite, and forsterite; (3) magnesia diamond; (4) a material mainly including the above materials; and (5) a material mainly including a mixture of the above materials.

The low-acoustic-velocity film 326 is a film where the acoustic velocity of bulk waves in the low-acoustic-velocity film 326 is lower than that of elastic waves propagating through the piezoelectric layer 327, and is disposed between the piezoelectric layer 327 and the high-acoustic-velocity supporting substrate 328. With this structure and the essential characteristic that energy is concentrated in a medium in which the acoustic velocity of elastic waves is low, leakage of SAW energy to the outside of the IDT electrodes is reduced or prevented. The low-acoustic-velocity film 326 is preferably, for example, a film that has silicon dioxide as a main component. The thickness of the low-acoustic-velocity film 326 is preferably less than or equal to about 2λ where λ is the wavelength of elastic waves defined by the electrode pitch of the IDT electrodes 32a or 32b, and is preferably, for example, about 670 nm.

According to the above-described multilayer structure of the substrate 320, compared with a conventional structure that includes a piezoelectric substrate as a single layer, the Q factor at the resonant frequency and the anti-resonant frequency is able to be greatly increased. That is, because a SAW resonator with a high Q factor is able to be provided, a filter with a low insertion loss is able to be provided using this SAW resonator.

Note that the high-acoustic-velocity supporting substrate 328 may have a structure in which a supporting substrate and a high-acoustic-velocity film are laminated, in which the acoustic velocity of bulk waves propagating through the high-acoustic-velocity film is higher than that of elastic waves such as surface waves or boundary waves propagating through the piezoelectric layer 327. In this case, the supporting substrate may be made of, for example, the following materials: sapphire, a piezoelectric body such as lithium tantalate, lithium niobate, or crystal; various types of ceramics such as alumina, magnesia, silicon nitride, aluminum nitride, silicon carbide, zirconia, cordierite, mullite, steatite, and forsterite; a dielectric such as glass; semiconductor such as silicon or gallium nitride; resin substrate; etc. In addition, the high-acoustic-velocity film may be made of various high-acoustic-velocity materials, for example, as follows: aluminum nitride, aluminum oxide, silicon carbide, silicon nitride, silicon oxynitride, DLC film, or diamond; a medium mainly including the above-described materials; and a medium mainly including a mixture of the above-described materials.

Although the example in which the IDT electrodes 32a and 32b included in the filter 12 are provided on the substrate 320 including the piezoelectric layer 327 has been described in the present preferred embodiment, a substrate on which the IDT electrodes 32a and 32b are provided may be a piezoelectric substrate including a single layer of the piezoelectric layer 327. The piezoelectric substrate in this case is preferably made of, for example, LiTaO$_3$ piezoelectric single crystal or another piezoelectric single crystal such as LiNbO$_3$.

In addition, a substrate on which the IDT electrodes 32a and 32b are provided may have a structure in which a piezoelectric layer is laminated on a supporting substrate, instead of a structure that is entirely made of a piezoelectric layer, as long as the structure includes a piezoelectric layer.

In addition, although the piezoelectric layer 327 according to the above-described present preferred embodiment includes a 50° Y-cut X-propagation LiTaO$_3$ piezoelectric single crystal, the cut angle of the single crystal material is not restricted to this. In other words, the multilayer structure, materials, and thickness may be appropriately changed in accordance with the bandpass characteristics required for the elastic wave filter apparatus, and the same or similar advantageous effects are able to be achieved even by a SAW filter including a LiTaO$_3$ piezoelectric substrate or a LiNbO$_3$ piezoelectric substrate with a cut angle different from the above.

Here, the design parameters of the resonators will be described.

At first, design parameters regarding the IDT electrodes 32a and 32b will be described.

The wavelength of a SAW resonator is defined by a wavelength $\lambda_{IDT}$ (hereinafter, an IDT wavelength $\lambda_{IDT}$)

which is a repetition cycle of the electrode fingers 322a or 322b defining the IDT electrodes 32a and 32b illustrated in a middle portion of FIG. 4. In addition, the electrode pitch (electrode cycle) is half of the IDT wavelength $\lambda_{IDT}$ and is defined by (W+S) where W is the line width of the electrode fingers 322a and 322b defining the IDT electrodes 32a and 32b and S is the space width between the adjacent electrode fingers 322a and 322b. In addition, the cross width L of the IDT electrodes 32a and 32b is the length of electrode fingers that overlap each other when viewed from the X-axis direction of the electrode fingers 322a of the IDT electrode 32a and the electrode fingers 322b of the IDT electrode 32b, as illustrated in an upper portion of FIG. 4. In addition, the electrode duty of each resonator is the line width occupancy of the electrode fingers 322a and 322b, which is the line width ratio relative to the sum of the line width and the space width of the electrode fingers 322a and 322b, and which is defined by W/(W+S).

Next, design parameters regarding the reflectors 32c will be described.

The wavelength $\lambda_{REF}$ of each of the reflectors 32c (hereinafter, the REF wavelength $\lambda_{REF}$) is preferably about twice the repetition cycle of the reflection electrode fingers 322c defining each reflector 32c, and is specifically about twice the center-to-center distance of two reflection electrode fingers 322c disposed next to each other.

Further, parameters regarding the relative arrangement of the IDT electrodes 32a and 32b and the reflectors 32c will be described.

The distance between the IDT electrodes 32a and 32b and each of the reflectors 32c (hereinafter, the IDT-reflector spacing $\lambda_{ga}$) is the ratio of the distance between the IDT electrodes 32a and 32b and each of the reflectors 32c relative to the IDT wavelength $\lambda_{IDT}$. Specifically, the IDT-reflector spacing $\lambda_{ga}$ is the center-to-center distance between (i) the electrode finger closest to each of the reflectors 32c among the electrode fingers 322a and 322b defining the IDT electrodes 32a and 32b and (ii) the reflection electrode finger 322c closest to the IDT electrodes 32a and 32b among the reflection electrode fingers 322c defining each of the reflectors 32c. In other words, the IDT-reflector spacing $\lambda_{ga}$ is the center-to-center distance between the electrode finger 322a, 322b and the reflection electrode finger 322c adjacent to each other in a direction in which elastic waves propagate.

In general, the IDT-reflector spacing $\lambda_{ga}$ is about 0.5λ, for example, because it is designed to be a spacing equivalent to the repetition cycle of the plurality of electrode fingers 322a and 322b and the repetition cycle of the plurality of refection electrode fingers 322c in order to propagate elastic waves smoothly. However, the inventor of preferred embodiments of the present invention discovered that, because of this factor, ripples are generated in the passband in a multiplexer (quadplexer 1 in the present preferred embodiment) that bundles a plurality of filters, as illustrated in FIG. 5.

Figure 5:
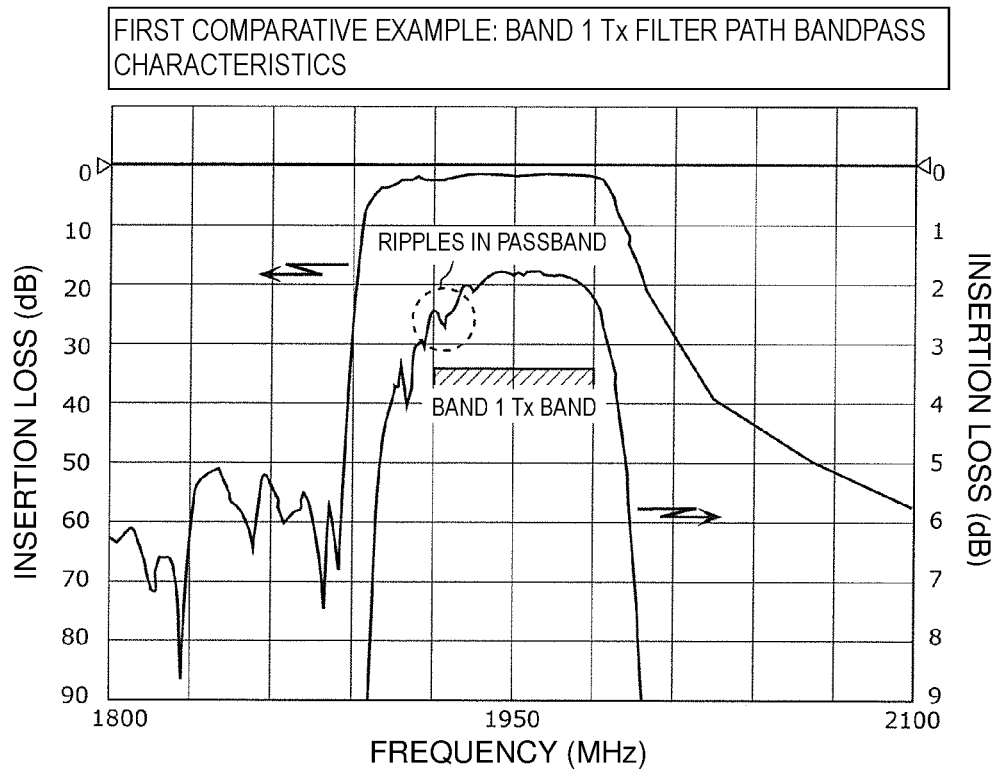
FIG. 5 is a graph illustrating a problem that occurs in a first comparative example.

FIG. 5 is a graph illustrating a problem that occurs in a first comparative example described below. Specifically, the graph illustrates the bandpass characteristics of a path that goes through the filter 22 (Band 1 Tx filter) in the case in which the IDT-reflector spacing $\lambda_{ga}$ is about 0.5λ. More specifically, the graph illustrates an insertion loss which is the ratio of the intensity of a signal output from one of the individual port 22 and the common terminal Port 1 relative to the intensity of a signal input to the other of the individual port 22 and the common terminal Port 1.

As illustrated in the graph, in the case in which the IDT-reflector spacing $\lambda_{ga}$ is about 0.5λ, which is a general spacing, ripples are generated in the Band 1 Tx band (that is, the passband of the filter 22) ("ripples in passband" portion in the graph).

In contrast, the inventor of preferred embodiments of the present invention discovered that, in such a multiplexer, the above-described ripples generated in the passband are able to be reduced or prevented by setting the IDT-reflector spacing $\lambda_{ga}$ of a series resonator closest to the common terminal to greater than or equal to about 0.44λ and less than about 0.5λ, for example.

To this end, a typical example of the quadplexer 1 according to the present preferred embodiment will be described below by using an example in comparison with the first comparative example. A quadplexer according to the first comparative example has the same or substantially the same configuration as the quadplexer 1 according to the example except that the IDT-reflector spacing $\lambda_{ga}$ of the series resonator 121s is about 0.5λ.

Table 1 indicates the details of the design parameters (IDT wavelength $\lambda_{IDT}$ (electrode pitch×2), REF wavelength $\lambda_{REF}$ (electrode pitch×2), cross width L, IDT number-of-pairs $N_{IDT}$, number of reflection electrode fingers $N_{REF}$, IDT-reflector spacing $\lambda_{ga}$, and electrode duty D) of the series resonators 121s to 125s and the parallel resonators 121p to 124p of the filter 12 according to the present example.

TABLE 1

|  | SERIES RESONATOR 121s | SERIES RESONATOR 122s | SERIES RESONATOR 123s | SERIES RESONATOR 124s | SERIES RESONATOR 125s |
|---|---|---|---|---|---|
| IDT WAVELENGTH $\lambda_{IDT}$ (μm) | 2.142 | 2.1678 | 2.1646 | 2.1694 | 2.1445 |
| REF WAVELENGTH $\lambda_{REF}$ (μm) | " | " | " | " | " |
| CROSS WIDTH L (μm) | 17.6 | 33 | 18 | 20.1 | 18.7 |
| IDT NUMBER OF PAIRS $N_{IDT}$ | 150 | 107 | 128 | 190 | 140 |
| NUMBER OF REFLECTION ELECTRODE FINGERS $N_{REF}$ | 21 | 21 | 21 | 21 | 21 |
| IDT-REFLECTOR SPACING $\lambda_{ga}$ | 0.45 | 0.5 | 0.5 | 0.5 | 0.5 |
| ELECTRODE DUTY D | 0.5 | 0.5 | 0.5 | 0.5 | 0.5 |

|  | PARALLEL RESONATOR 121p | PARALLEL RESONATOR 122p | PARALLEL RESONATOR 123p | PARALLEL RESONATOR 124p |
|---|---|---|---|---|
| IDT WAVELENGTH $\lambda_{IDT}$ (μm) | 2.2506 | 2.2398 | 2.2507 | 2.2508 |
| REF WAVELENGTH $\lambda_{REF}$ (μm) | " | " | " | " |
| CROSS WIDTH L (μm) | 48.8 | 32.8 | 82 | 80 |
| IDT NUMBER OF PAIRS $N_{IDT}$ | 113 | 108 | 38 | 60 |

TABLE 1-continued

| | | | | |
|---|---|---|---|---|
| NUMBER OF REFLECTION ELECTRODE FINGERS $N_{REF}$ | 21 | 21 | 21 | 21 |
| IDT-REFLECTOR SPACING $\lambda_{ga}$ | 0.5 | 0.5 | 0.5 | 0.5 |
| ELECTRODE DUTY D | 0.5 | 0.5 | 0.5 | 0.5 |

As indicated in Table 1 above, in the series resonator 121s closest to the common terminal Port 1 among the series resonators 121s to 125s, the IDT-reflector spacing $\lambda_{ga}$ is about 0.45, for example. In other words, the IDT-reflector spacing $\lambda_{ga}$ in the series resonator 121s is about $0.45 \times \lambda_{IDT}$ (µm). Hereinafter, $\lambda_{IDT}$ may be simply written as $\lambda$.

Advantageous effects achieved by the quadplexer 1 according to the example configured as described above will be described below in comparison with a quadplexer according to the first comparative example.

Figure 6:
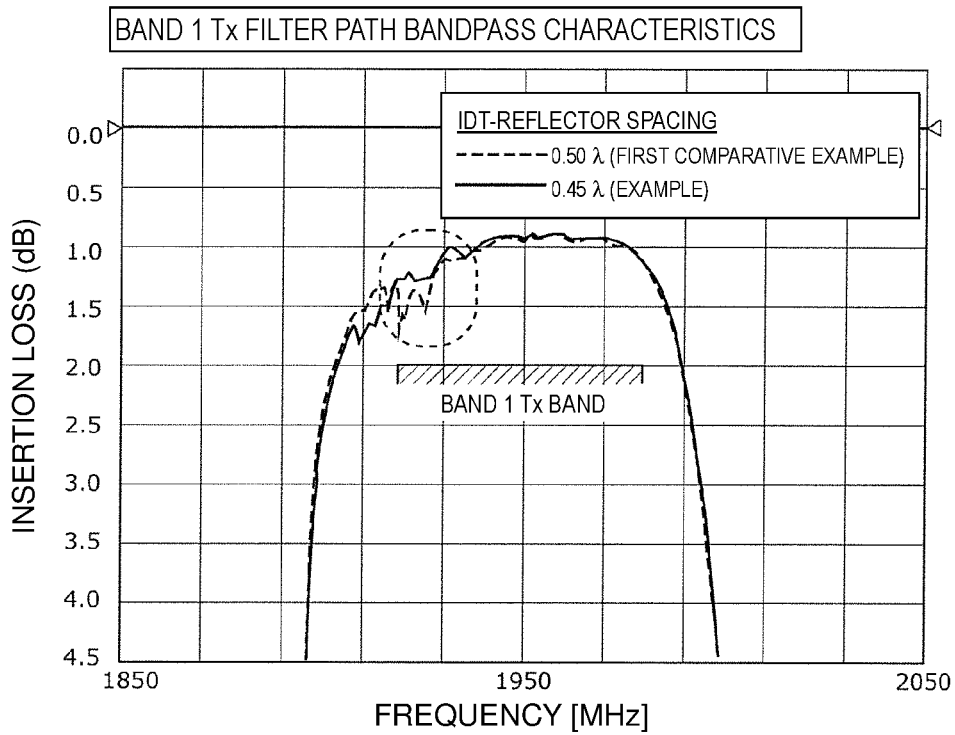
FIG. 6 is a graph illustrating the bandpass characteristics of a quadplexer according to an example of a preferred embodiment of the present invention in comparison with the first comparative example.

FIG. 6 is a graph illustrating the bandpass characteristics of the quadplexer 1 according to the example in comparison with the first comparative example. Specifically, the graph illustrates the bandpass characteristics of a path that goes through the filter 22 (Band 1 Tx filter), and more specifically illustrates an insertion loss which is the ratio of the intensity of a signal output from the common terminal Port 1 relative to the intensity of a signal input to the individual terminal Port 22.

As is clear from the graph, compared with the first comparative example, ripples in the passband (here, in the Band 1 Tx band) are reduced in the example (a portion enclosed by a broken line in the graph).

This is because of the following reason.

Figure 7:
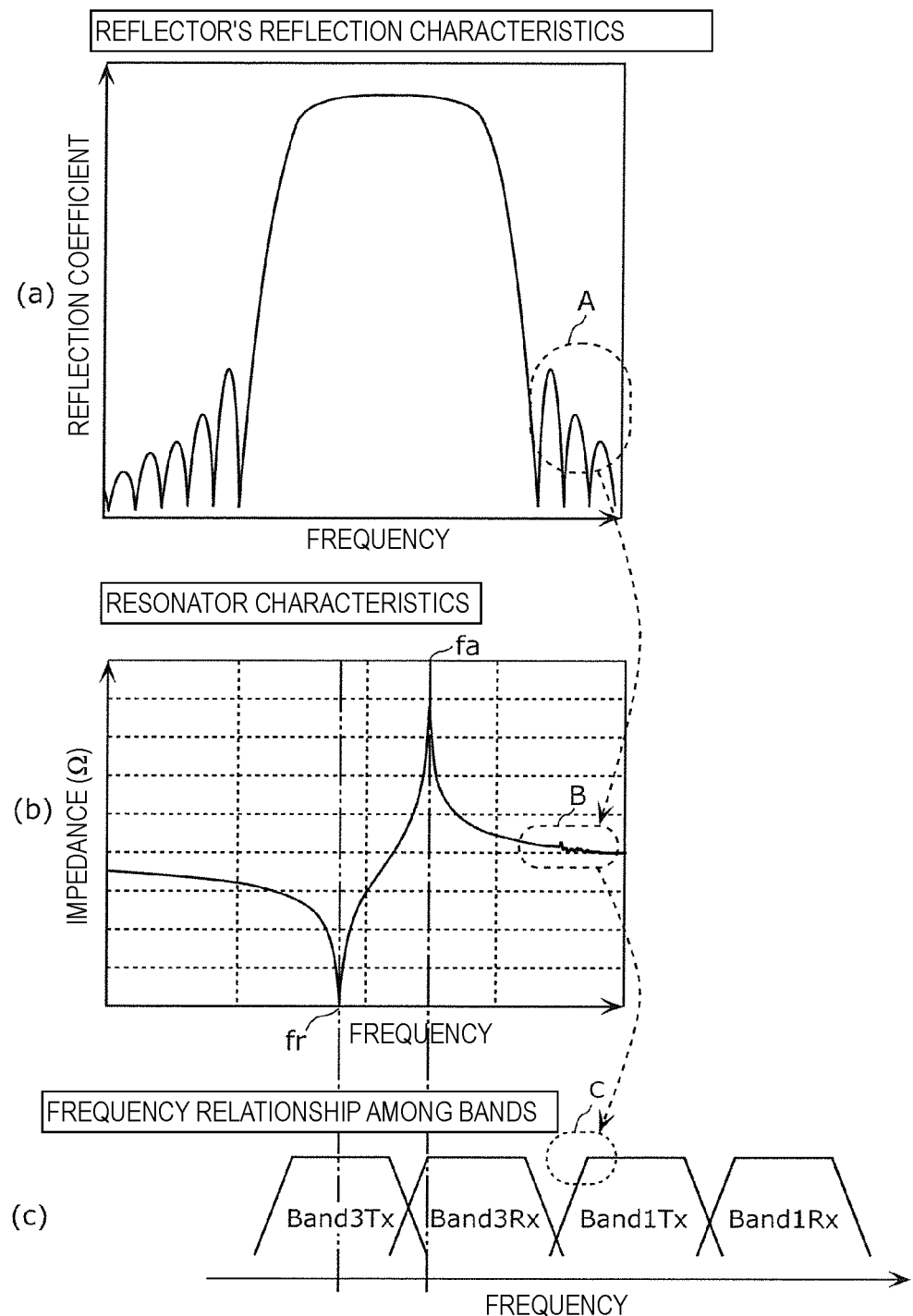
FIGS. 7(a), 7(b), and 7(c) include diagrams conceptually illustrating a factor causing ripples in the passband in the first comparative example.

FIG. 7 includes diagrams conceptually illustrating a factor causing ripples in the passband in the first comparative example. Part (a) of FIG. 7 is a graph schematically illustrating the reflection characteristics of the reflectors 32c included in the resonator, which specifically illustrates the frequency characteristics of the reflection coefficient. Part (b) of FIG. 7 is a graph schematically illustrating the resonance characteristics of the resonator, which specifically illustrates the frequency characteristics (impedance characteristics) of the impedance of the resonator. Part (c) of FIG. 7 is a diagram describing the frequency relationship between Band 1 and Band 3, as in FIG. 2, and filter characteristics required for each of the filters 11, 12, 21, and 22 are schematically indicated by a solid line.

The reflectors 32c are designed to have a high reflection coefficient in a certain band including the resonant frequency of the resonator in order to confine the propagated surface acoustic waves without leaking to the outside.

At this time, as illustrated in part (a) of FIG. 7, bouncing back of the reflection coefficient, which is the repetition of the reflection coefficient becoming greater and smaller, occurs in a peripheral band of a certain band at which the reflection coefficient is high (A portion in the graph).

In the SAW resonator, due to this bouncing back of the reflection coefficient, as illustrated in part (b) of FIG. 7, ripples are generated in the impedance characteristics at frequencies higher than the resonance characteristics (that is, at frequencies higher than both of a resonant frequency fr and an anti-resonant frequency fa) (B portion in the graph).

In general, a filter with a ladder filter structure defines a bandpass filter that has a resonant frequency frs of a series resonator and an anti-resonant frequency fap of a parallel resonator as the center frequency of the passband by substantially matching frs and fap. Therefore, if a SAW resonator is used as a series resonator in a ladder filter structure, stopband ripples (ripples generated in a stopband) are caused by the above-described ripples in a stopband that is on the higher frequency side of the bandpass filter.

Such stopband ripples do not matter much in the filter alone. However, in a multiplexer including a plurality of filters, in the case in which a frequency at which stopband ripples occur in one filter is positioned in another filter's passband, the stopband ripples may increase ripples (passband ripples) in this other filter's passband.

At this time, in a multiplexer (quadplexer) combining the Band-3 duplexer 10 and the Band-1 duplexer 20, in the case in which the IDT-reflector spacing $\lambda_{ga}$ of the series resonator 121s of the filter 12 for the Band 3 Tx band is about $0.5\lambda$, as in the first comparative example, ripples caused by the series resonator 121s are positioned in the Band 1 Tx band (see parts (a) and (b) of FIG. 7). Therefore, in the first comparative example, as illustrated in part (c) of FIG. 7, ripples are generated in the passband on a path that goes through the filter 22 (Band 1 Tx filter) (C portion in the graph).

In contrast, in the example, ripples in the passband are able to be reduced or prevented on a path that goes through the filter 22 (Band 1 Tx filter) by setting the IDT-reflector spacing $\lambda_{ga}$ of the series resonator 121s of the filter 12 for the Band 3 Tx band to about $0.45\lambda$.

This point will be described with reference to FIG. 8.

Figure 8:
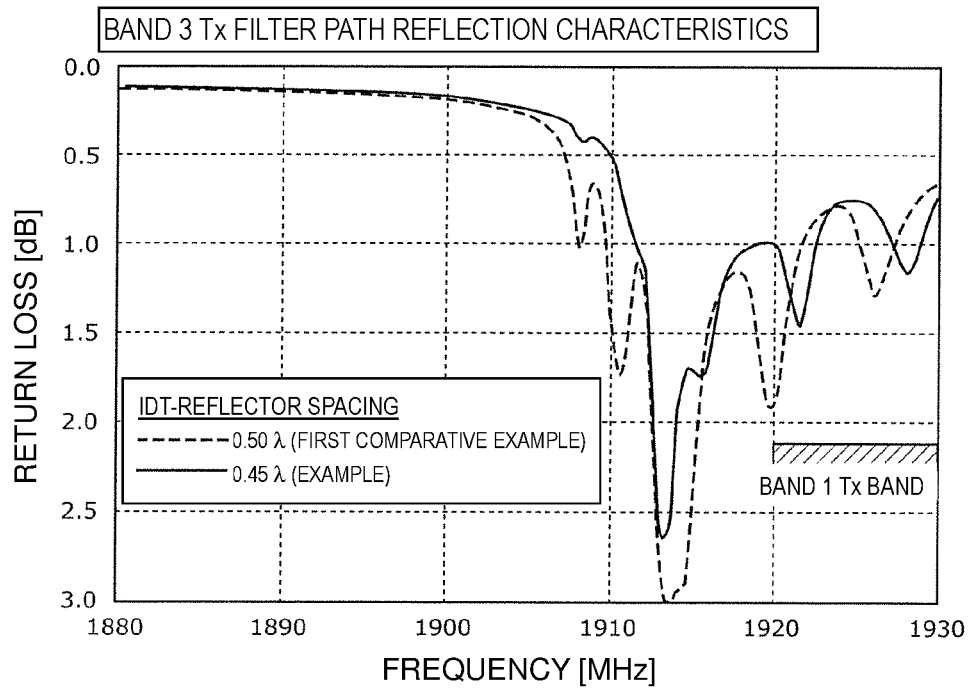
FIG. 8 is a graph illustrating the reflection characteristics of the quadplexer according to the example, in comparison with the first comparative example.

FIG. 8 is a graph illustrating the reflection characteristics of the quadplexer 1 according to the example, in comparison with the first comparative example. Specifically, the graph illustrates the reflection characteristics of a path that goes through the filter 12 (Band 3 Tx filter), and more specifically illustrates a return loss which is the ratio of the intensity of a signal output from the path to the common terminal Port 1 relative to the intensity of a signal input from the common terminal Port 1 to the path.

As is clear from the graph in FIG. 8, compared with the first comparative example, the level of stopband ripples generated in the Band 1 Tx band is smaller on a path that goes through the Band 3 Tx filter. This is due to changes in the characteristics of the stopband on a path that goes through the Band 3 Tx filter (here, the bandpass characteristics in the stopband of the Band 3 Tx filter), which are caused by reducing the IDT-reflector spacing $\lambda_{ga}$ from about $0.5\lambda$ in the first comparative example to about 0.45, in the example.

Here, if a plurality of filters (the filters 11, 12, 21, and 22 in the present preferred embodiment) are bundled to define a multiplexer, characteristics of a series resonator closest to the common terminal Port 1 in one filter (characteristics of the series resonator 121s in the Band 3 Tx filter in the present preferred embodiment) affect characteristics of the other filter(s) (Band 3 Rx filter, Band 1 Tx filter, and Band 1 Rx filter in the present preferred embodiment).

Specifically, because the IDT-reflector spacing $\lambda_{ga}$ is set to about $0.5\lambda$ in the first comparative example, the position of a frequency at which the stopband ripples of the filter 12 (Band 3 Tx filter) are generated coincides with the frequency band of the filter 22 (Band 1 Tx filter), thus causing ripples in the bandpass characteristics of the Band 1 Tx filter. In contrast, in the example, by reducing the IDT-reflector spacing $\lambda_{ga}$ of the series resonator 121s (about 0.45, in the example), the stopband ripples of the filter 22 are able to be reduced. Thus, in the example, compared with the first comparative example, ripples generated in the passband of the filter 22 (Band 1 Tx filter) are able to be reduced or prevented.

In this manner, the inventor of preferred embodiments of the present discovered that ripples generated in the passband of the filter 22 (Band 1 Tx filter) are able to be reduced or prevented by setting the IDT-reflector spacing $\lambda_{ga}$ of the series resonator 121s closest to the port 1 in the filter 12 (Band 3 Tx filter) to less than about 0.5λ.

Next, another discovery by the inventor of preferred embodiments of the present invention will be described.

Figure 9:
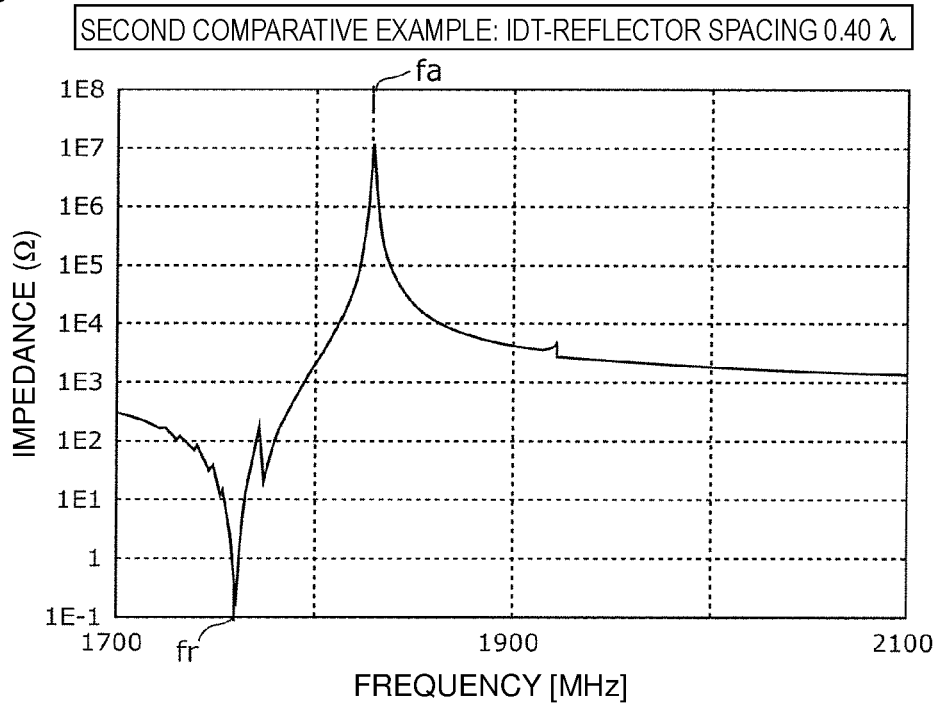
FIG. 9 is a graph illustrating the impedance characteristics of a resonator according to a second comparative example.

FIG. 9 is a graph illustrating the impedance characteristics of a resonator according to a second comparative example.

A resonator in the second comparative example is a one-port resonator with the same or substantially the same configuration as the series resonator 121s in the example and the first comparative example, except that the IDT-reflector spacing $\lambda_{ga}$ is about 0.4λ.

As illustrated in the graph, in the resonator having the foregoing configuration, ripples are generated in the impedance characteristics in a frequency band between the resonance point and the anti-resonance point (i.e., a frequency band between the resonant frequency fr and the anti-resonant frequency fa). As has been described above, in general, a filter with a ladder filter structure defines a bandpass filter that has a resonant frequency frs of a series resonator and an anti-resonant frequency fap of a parallel resonator as the center frequency of the passband by substantially matching frs and fap. Therefore, if a resonator in which ripples are generated between the resonance point and the anti-resonance point is used as a series resonator, ripples caused by these ripples may be generated in the passband of the bandpass filter.

That is, if the IDT-reflector spacing $\lambda_{ga}$ of the series resonator 121s closest to the common terminal Port 1 in the filter (Band 3 Tx filter) is too small in an attempt to reduce or prevent ripples generated in the passband of the filter 22 (Band 1 Tx filter), another problem arises that ripples may be generated in the passband of the filter 12 itself.

Figure 10:
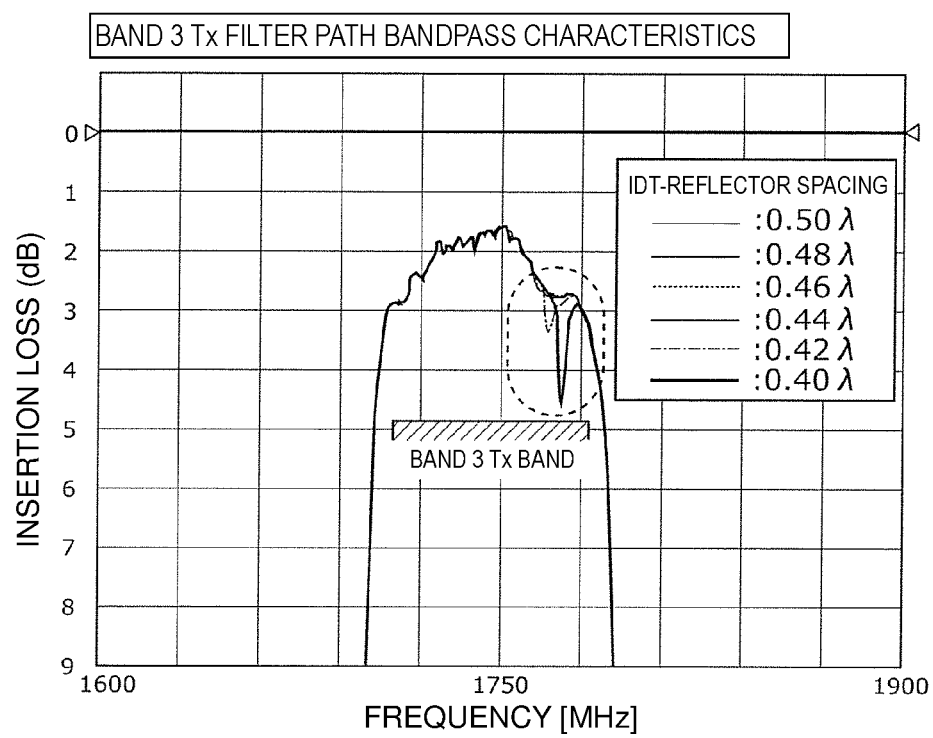
FIG. 10 is a graph illustrating the bandpass characteristics of the filter when the IDT-reflector spacing is changed.

FIG. 10 is a graph illustrating the bandpass characteristics of the filter 12 when the IDT-reflector spacing $\lambda_{ga}$ in the series resonator 121s is changed at an interval of about 0.02λ from about 0.40λ to about 0.50λ. Specifically, the graph illustrates the bandpass characteristics of a path that goes through the filter 12 (Band 3 Tx filter), and more specifically illustrates an insertion loss which is the ratio of the intensity of a signal output from the common terminal Port 1 relative to the intensity of a signal input to the individual terminal Port 12.

As is clear from the graph, if the IDT-reflector spacing $\lambda_{ga}$ is about 0.42λ, ripples are generated in the passband of the filter 12. However, almost no ripples are generated at about 0.44λ (a portion enclosed by a broken line in the graph).

In this manner, the inventor of preferred embodiments of the present invention discovered that the occurrence of ripples generated in the passband of the filter 12 (Band 3 Tx filter) is able to be reduced or prevented by setting the IDT-reflector spacing $\lambda_{ga}$ of the series resonator 121s closest to the common terminal Port 1 in the filter 12 (Band 3 Tx filter) to greater than or equal to about 0.44λ.

As has been described above, the inventor of preferred embodiments of the present invention discovered that, as a result of extensive study, ripples in the passband are able to be reduced or prevented when the distance between the IDT electrodes 32a and 32b and each of the reflectors 32c (the IDT-reflector spacing $\lambda_{ga}$ in the present preferred embodiment) is greater than or equal to about 0.44λ and less than about 0.5λ in a series resonator (the series resonator 121s in the present preferred embodiment) closest to the common terminal Port 1 in the first filter (the filter 12 in the present preferred embodiment). Specifically, if the distance between the IDT electrodes 32a and 32b and each of the reflectors 32c is too small, ripples in the passband (the Band 3 Tx band in the present preferred embodiment) of the first filter increase. Alternatively, if the distance between the IDT electrodes 32a and 32b and each of the reflectors 32c is too large, ripples in the passband (the Band 1 Tx band in the present preferred embodiment) of the second filter (the filter 22 in the present preferred embodiment) increase. Therefore, ripples in the passband are able to be reduced or prevented in both of the first and second filters by maintaining the distance between the IDT electrodes 32a and 32b and each of the reflectors 32c within an appropriate range.

In addition, the inventor of preferred embodiments of the present invention discovered that, as a result of extensive study, an increase of ripples in the passband of the second filter is able to be more reliably reduced or prevented in the case in which the distance between the IDT electrodes 32a and 32b and each of the reflectors 32c is less than or equal to about 0.48λ. Specifically, ripples in the passband of the second filter may increase when the distance between the IDT electrodes 32a and 32b and each of the reflectors 32c is increased to approach about 0.5λ. Therefore, ripples in the second filter are able to be more reliably reduced or prevented by setting the distance between the IDT electrodes 32a and 32b and each of the reflectors 32c to less than or equal to about 0.48λ.

In the first preferred embodiment, for the first filter (filter 12 in the first preferred embodiment), the configuration that only includes a ladder filter structure has been described by way of example. However, the first filter may have, in addition to the ladder filter structure, a longitudinally-coupled filter structure. In the present modification, a quadplexer including a first filter that has such a filter structure will be described. Among a plurality of filters included in the quadplexer, filters other than the first filter have a configuration that is the same as or similar to that of the first preferred embodiment, and therefore descriptions thereof will be omitted.

Figure 11:
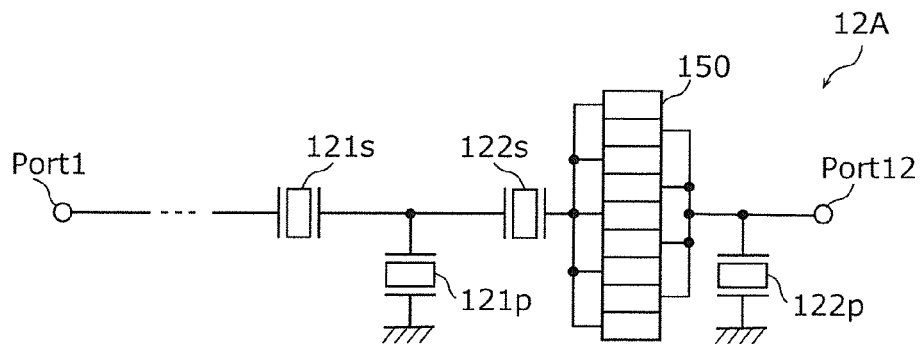
FIG. 11 is a circuit configuration diagram of a filter according to a modification of the first preferred embodiment of the present invention.

FIG. 11 is a circuit configuration diagram of a filter 12A (first filter) according to the modification of the first preferred embodiment.

As illustrated in the diagram, the filter 12A includes series resonators 121s and 122s, parallel resonators 121p and 122p, and a longitudinally-coupled resonator 150. In other words, the filter 12A includes the longitudinally-coupled resonator 150 in addition to a ladder filter structure.

The longitudinally-coupled resonator 150 has a longitudinally-coupled filter structure provided between the common terminal Port 1 and the individual terminal Port 12. In the present preferred embodiment, the longitudinally-coupled resonator 150 is disposed on the individual terminal Port 12 side of the series resonator 122s, and preferably includes nine IDTs and reflectors arranged on both sides of the IDTs, for example. Note that the position at which the longitudinally-coupled resonator 150 is disposed is not restricted to this, and, for example, the position may be between the series resonator 121s and the series resonator 122s or on the common terminal Port 1 side of the series resonator 121s.

Even in a quadplexer including the first filter (filter 12A in the present modification) configured as described above, as in the first preferred embodiment, ripples in the passband are able to be reduced or prevented by setting the distance between the IDT electrodes 32a and 32b and each of the reflectors 32c to greater than or equal to about 0.44λ and less than about 0.5λ in a series resonator (the series resonator 121s in the present preferred embodiment) closest to the common terminal Port 1.

In addition, according to the filter 12A according to the modification of the present preferred embodiment, the quadplexer is able to adapt to the required filter characteristics, such as enhancement of attenuation by including a longitudinally-coupled filter structure.

Second Preferred Embodiment

The quadplexer according to the first preferred embodiment and its modification is applicable to an RF front-end circuit and further to a communication apparatus including the RF front-end circuit. In the present preferred embodiment, such an RF front-end circuit and a communication apparatus will be described.

Figure 12:
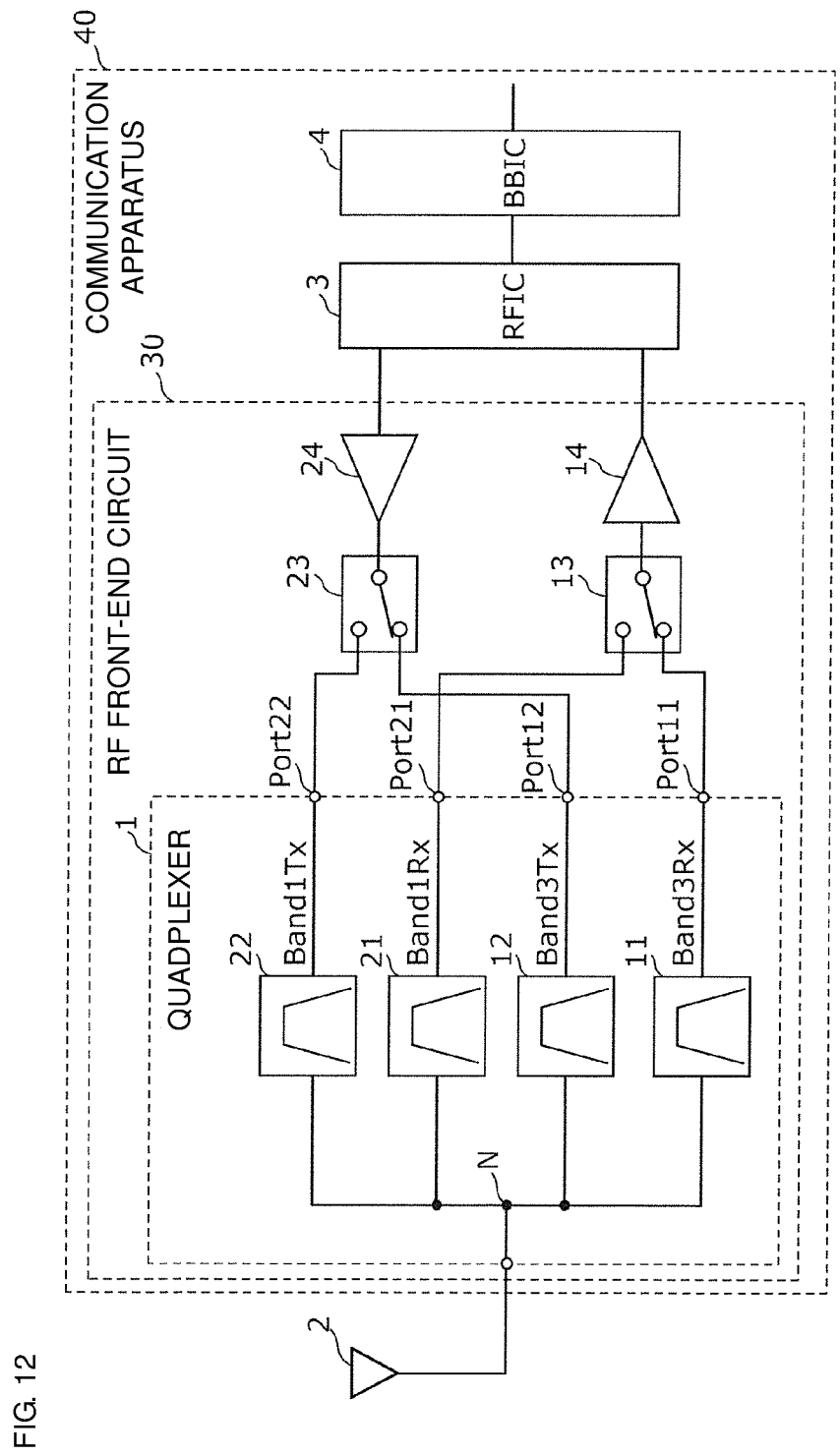
FIG. 12 is a configuration diagram of an RF front-end circuit according to a second preferred embodiment of the present invention.

FIG. 12 is a configuration diagram of an RF front-end circuit 30 according to a second preferred embodiment of the present invention. Note that elements (the antenna element 2, an RF signal processing circuit (RFIC) 3, and a baseband signal processing circuit (BBIC) 4) connected to the RF front-end circuit 30 are additionally illustrated in the diagram. The RF front-end circuit 30, the RF signal processing circuit 3, and the baseband signal processing circuit 4 define a communication apparatus 40.

The RF front-end circuit 30 includes the quadplexer 1 according to the first preferred embodiment, a reception-side switch 13, a transmission-side switch 23, a low-noise amplifier circuit 14, and a power amplifier circuit 24.

The reception-side switch 13 includes two selection terminals respectively connected to the individual terminals Port 11 and Port 21, which are reception terminals of the quadplexer 1, and a common terminal connected to the low-noise amplifier circuit 14.

The transmission-side switch 23 includes two selection terminals respectively connected to the individual terminals Port 12 and Port 22, which are transmission terminals of the quadplexer 1, and a common terminal connected to the power amplifier circuit 24.

The reception-side switch 13 and the transmission-side switch 23 are each preferably, for example, a SPDT (Single Pole Double Throw) switch, which connects the common terminal and a signal path corresponding to a certain band in accordance with a control signal from a controller (not illustrated). Note that the number of signal paths connected to the common terminal is not restricted to one, and may be more than one. In other words, the RF front-end circuit 30 may be provided for carrier aggregation.

The low-noise amplifier circuit 14 is a reception amplifier circuit that amplifies an RF signal (here, an RF reception signal) having gone through the antenna element 2, the quadplexer 1, and the reception-side switch 13, and outputs the amplified signal to the RF signal processing circuit 3.

The power amplifier circuit 24 is a transmission amplifier circuit that amplifies an RF signal (here, an RF transmission signal) output from the RF signal processing circuit 3 and outputs the amplified signal to the antenna element 2 via the transmission-side switch 23 and the quadplexer 1.

The RF signal processing circuit 3 performs signal processing on an RF reception signal input from the antenna element 2 via a reception signal path by, for example, down-converting the RF reception signal, and outputs a reception signal generated by the signal processing to the baseband signal processing circuit 4. In addition, the RF signal processing circuit 3 performs signal processing on a transmission signal input from the baseband signal processing circuit 4 by, for example, up-converting the transmission signal, and outputs an RF transmission signal generated by the signal processing to the power amplifier circuit 24. The RF signal processing circuit 3 is preferably, for example, an RFIC.

A signal processed by the baseband signal processing circuit 4 is used as, for example, an image signal to display an image, or an audio signal for conversation.

Note that the RF front-end circuit 30 may include other circuit elements between the above-described elements.

According to the RF front-end circuit 30 and the communication apparatus 40 described above, ripples in the passband are able to be reduced or prevented by including the quadplexer 1 according to the first preferred embodiment.

Note that the RF front-end circuit 30 may include, instead of the quadplexer 1 according to the first preferred embodiment, a quadplexer according to the modification of the first preferred embodiment.

In addition, the communication apparatus 40 need not include the baseband signal processing circuit (BBIC) 4 depending on the RF signal processing method.

Although the multiplexers, the RF front-end circuits, and the communication apparatuses according to preferred embodiments of the present invention have been described with reference to the preferred embodiments and their modifications, the present invention includes another preferred embodiment provided by combining arbitrary elements in the above-described preferred embodiments and modifications, a modification obtained by applying various changes conceivable to those skilled in the art to the above-described preferred embodiments without departing from the gist of the present invention, and various devices including the multiplexers, the RF front-end circuits, and the communication apparatuses according to preferred embodiments of the present invention.

For example, although a quadplexer has been described as a multiplexer by way of example in the description above, preferred embodiments of the present invention are applicable to, for example, a triplexer in which the antenna terminals of three filters are commonly connected or a hexaplexer in which the antenna terminals of six filters are commonly connected. In other words, the multiplexer only needs to include two or more filters.

Furthermore, the multiplexer is not restricted to a configuration that includes both a transmission filter and a reception filter, but may be a configuration including only transmission filters or reception filters.

In addition, it has been described in the first preferred embodiment that the filter 12 corresponds to the first filter and the filter 22 corresponds to the second filter. In other words, the first and second filters are both transmission filters in the first preferred embodiment. However, in the case in which the distance between the IDT electrode and the reflector is set to about 0.5λ, which is a general distance, in a series resonator closest to the common terminal of the first filter, the present invention is not restricted by applications of the first and second filters, and is applicable to a multiplexer in which stopband ripples of the first filter are positioned in the passband of the second filter. Therefore, at least one of the first and second filters may be a reception filter.

Preferred embodiments of the present invention may be widely used as a multiplexer, a front-end circuit, and a communication apparatus applicable to a multiband system in communication devices, such as cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
    a common terminal;
    a first terminal and a second terminal;
    a first filter disposed on a first path connecting the common terminal and the first terminal; and
    a second filter disposed on a second path connecting the common terminal and the second terminal, the second filter having a passband with frequencies higher than a passband of the first filter; wherein
    the first filter has a ladder filter structure including one or more series resonators disposed on the first path and one or more parallel resonators disposed on a path connecting the first path and ground;
    a series resonator that is closest to the common terminal among the one or more series resonators includes:
        an IDT electrode that excites elastic waves; and
        a reflector that reflects the elastic waves excited by the IDT electrode; and
    only the series resonator that is closest to the common terminal among the one or more series resonators includes a distance between the IDT electrode and the reflector that is greater than or equal to about 0.44λ and less than about 0.5λ where λ is a wavelength of the elastic waves that is defined by an electrode cycle of the IDT electrode.

2. The multiplexer according to claim 1, wherein in the series resonator that is closest to the common terminal among the one or more series resonators, the distance between the IDT electrode and the reflector is less than or equal to about 0.48λ.

3. The multiplexer according to claim 1, wherein the reflector is disposed in a direction in which the elastic waves propagate with respect to the IDT electrode.

4. The multiplexer according to claim 1, wherein the first filter has a ladder filter structure including a plurality of stages.

5. The multiplexer according to claim 1, wherein the first filter further includes a longitudinally-coupled filter structure disposed on the first path.

6. The multiplexer according to claim 1, further comprising:
    a piezoelectric film including a main surface on which the IDT electrode and the reflector are provided;
    a high-acoustic-velocity supporting substrate in which an acoustic velocity of bulk waves propagating therethrough is higher than an acoustic velocity of elastic waves propagating through the piezoelectric film; and
    a low-acoustic-velocity film disposed between the high-acoustic-velocity supporting substrate and the piezoelectric film, in which an acoustic velocity of bulk waves propagating through the low-acoustic-velocity film is lower than the acoustic velocity of bulk waves propagating through the piezoelectric film.

7. The multiplexer according to claim 1, wherein the multiplexer is defined by a first duplexer including two filters including the first filter and a second duplexer including two filters including the second filter.

8. The multiplexer according to claim 1, wherein
    the passband of the first filter is an uplink frequency band of Band 3; and
    the passband of the second filter is an uplink frequency band of Band 1.

9. A radio-frequency front-end circuit comprising:
    the multiplexer according to claim 1; and
    an amplifier circuit connected to the multiplexer.

10. The radio-frequency front-end circuit according to claim 9, wherein in the series resonator that is closest to the common terminal among the one or more series resonators, the distance between the IDT electrode and the reflector is less than or equal to about 0.48λ.

11. The radio-frequency front-end circuit according to claim 9, wherein the reflector is disposed in a direction in which the elastic waves propagate with respect to the IDT electrode.

12. The radio-frequency front-end circuit according to claim 9, wherein the first filter has a ladder filter structure including a plurality of stages.

13. The radio-frequency front-end circuit according to claim 9, wherein the first filter further includes a longitudinally-coupled filter structure disposed on the first path.

14. The radio-frequency front-end circuit according to claim 9, further comprising:
    a piezoelectric film including a main surface on which the IDT electrode and the reflector are provided;
    a high-acoustic-velocity supporting substrate in which an acoustic velocity of bulk waves propagating therethrough is higher than an acoustic velocity of elastic waves propagating through the piezoelectric film; and
    a low-acoustic-velocity film disposed between the high-acoustic-velocity supporting substrate and the piezoelectric film, in which an acoustic velocity of bulk waves propagating through the low-acoustic-velocity film is lower than the acoustic velocity of bulk waves propagating through the piezoelectric film.

15. The radio-frequency front-end circuit according to claim 9, wherein the multiplexer is defined by a first duplexer including two filters including the first filter and a second duplexer including two filters including the second filter.

16. The radio-frequency front-end circuit according to claim 9, wherein
    the passband of the first filter is an uplink frequency band of Band 3; and
    the passband of the second filter is an uplink frequency band of Band 1.

17. A communication apparatus comprising:
    an RF signal processing circuit that processes a radio frequency signal transmitted and received by an antenna element; and
    the radio-frequency front-end circuit according to claim 9, the radio-frequency front-end circuit transferring the radio frequency signal between the antenna element and the RF signal processing circuit.

18. The communication apparatus according to claim 17, wherein in the series resonator that is closest to the common terminal among the one or more series resonators, the distance between the IDT electrode and the reflector is less than or equal to about 0.48λ.

19. The communication apparatus according to claim 17, wherein the reflector is disposed in a direction in which the elastic waves propagate with respect to the IDT electrode.

20. The communication apparatus according to claim 17, wherein the first filter has a ladder filter structure including a plurality of stages.

* * * * *